(12) United States Patent
Doellgast et al.

(10) Patent No.: US 11,024,794 B2
(45) Date of Patent: Jun. 1, 2021

(54) METHOD FOR PRODUCING A PLURALITY OF PIEZOELECTRIC MULTILAYER COMPONENTS

(71) Applicant: TDK Electronics AG, Munich (DE)

(72) Inventors: Bernhard Doellgast, Deutschlandsberg (AT); Markus Puff, Graz (AT)

(73) Assignee: TDK ELECTRONICS AG, Munich (DE)

( * ) Notice: Subject to any disclaimer, the term of this patent is extended or adjusted under 35 U.S.C. 154(b) by 35 days.

(21) Appl. No.: 16/306,512

(22) PCT Filed: May 31, 2017

(86) PCT No.: PCT/EP2017/063196
§ 371 (c)(1),
(2) Date: Apr. 12, 2019

(87) PCT Pub. No.: WO2017/207654
PCT Pub. Date: Dec. 7, 2017

(65) Prior Publication Data
US 2019/0252598 A1    Aug. 15, 2019

(30) Foreign Application Priority Data
Jun. 2, 2016 (DE) .......................... 102016110216.4

(51) Int. Cl.
*H01L 41/083* (2006.01)
*H01L 41/107* (2006.01)
(Continued)

(52) U.S. Cl.
CPC ...... *H01L 41/0835* (2013.01); *H01L 41/0471* (2013.01); *H01L 41/083* (2013.01);
(Continued)

(58) Field of Classification Search
CPC .................. H01L 41/0835; H01L 41/0471; H01L 41/083
See application file for complete search history.

(56) References Cited

U.S. PATENT DOCUMENTS 5,801,073 A * 9/1998 Robbins .................. H01L 21/50
257/E21.499
7,309,397 B2   12/2007 Schreiner et al.
(Continued)

FOREIGN PATENT DOCUMENTS

DE       691672 C    6/1940
DE     10205928 A1   8/2002
(Continued)

OTHER PUBLICATIONS

Kudo et al., "JP 2010010424 machine translation", published Jan. 14, 2010 (Year: 2010).*
(Continued)

*Primary Examiner* — Alex B Efta
(74) *Attorney, Agent, or Firm* — Slater Matsil, LLP

(57) ABSTRACT

A method for producing a plurality of piezoelectric multilayer components is disclosed. In an embodiment, a method for producing a plurality of piezoelectric multilayer components includes grinding the piezoelectric multilayer components without an addition of an abrasive by rubbing the piezoelectric multilayer components against one another so that a material abrasion of the piezoelectric multilayer components is carried out.

11 Claims, 3 Drawing Sheets

(51) Int. Cl.
*H01L 41/337* (2013.01)
*H01L 41/335* (2013.01)
*H01L 41/047* (2006.01)
*H01L 41/273* (2013.01)

(52) U.S. Cl.
CPC ......... *H01L 41/107* (2013.01); *H01L 41/273* (2013.01); *H01L 41/335* (2013.01); *H01L 41/337* (2013.01)

(56) References Cited

U.S. PATENT DOCUMENTS

| | | | |
|---|---|---|---|
| 2005/0018382 A1* | 1/2005 | Takazawa | H01F 17/0013 361/321.2 |
| 2012/0018204 A1* | 1/2012 | Sato | H01G 4/232 174/260 |
| 2013/0342080 A1 | 12/2013 | Suma | |
| 2017/0208675 A1* | 7/2017 | Doellgast | H01L 41/107 |

FOREIGN PATENT DOCUMENTS

| | | | | |
|---|---|---|---|---|
| DE | 102007019316 A1 | | 11/2008 | |
| DE | 102014110405 A1 | | 1/2016 | |
| JP | 05335741 A | * | 12/1993 | |
| JP | H07335481 A | | 12/1995 | |
| JP | 08316088 A | * | 11/1996 | |
| JP | H08316088 A | | 11/1996 | |
| JP | 2005183477 A | | 7/2005 | |
| JP | 2008227314 A | | 9/2008 | |
| JP | 2010010424 A | * | 1/2010 | |
| JP | 2010010424 A | | 1/2010 | |
| JP | 2011151148 A | * | 8/2011 | |
| JP | 2011151148 A | | 8/2011 | |
| JP | 2016004885 A | | 1/2016 | |
| WO | 2016012282 A1 | | 1/2016 | |

OTHER PUBLICATIONS

Tabuchi et al. "JP 08-316088 machine translation", published Nov. 29, 1996 (Year: 1996).*

Yamaguchi et al., "JP 05-335741 machine translation", published Dec. 17, 1993 (Year: 1993).*

Yoshitomo et al. " JP 2011151148 machine translation" published Aug. 4, 2011 (Year: 2011).*

* cited by examiner

METHOD FOR PRODUCING A PLURALITY OF PIEZOELECTRIC MULTILAYER COMPONENTS

This patent application is a national phase filing under section 371 of PCT/EP2017/063196, filed May 31, 2017, which claims the priority of German patent application 102016110216.4, filed Jun. 2, 2016, each of which is incorporated herein by reference in its entirety.

TECHNICAL FIELD

The present invention relates to a method for producing a plurality of piezoelectric multilayer components. The piezoelectric multilayer components can be, for example, piezoelectric transformers suitable for generating a non-thermal atmospheric pressure plasma.

BACKGROUND

During the production of piezoelectric multilayer components, the components may be subjected to a process in which disordered components are ground using loose grain as abrasive in order to obtain a smooth surface of the piezoelectric multilayer components.

Disadvantages of this process are that the components fabricated in this way have a surface that often does not satisfy the requirements in respect of smoothness. Furthermore, separating the abrasive from the components may be very complex.

SUMMARY OF THE INVENTION

Embodiments provide an improved method for producing a plurality of piezoelectric multilayer components.

According to an embodiment, a method for producing a plurality of piezoelectric multilayer components is proposed, wherein the piezoelectric multilayer components are ground without the addition of an abrasive, wherein a material abrasion of the piezoelectric multilayer components is carried out by rubbing the piezoelectric multilayer components against one another.

In particular, the material abrasion can be carried out only by rubbing the piezoelectric multilayer components against one another. Consequently, no abrasive is used in the method.

An "abrasive" can be understood here to mean any abrasive material that can be utilized for obtaining a material removal. An abrasive is typically a fine-grained, hard and sharp-edged substance. Known abrasives are sand or $ZrO_2$, for example.

The method according to embodiments of the invention is distinguished by dispensing with any abrasives. It has been found that by rubbing the multilayer components against one another, it is possible to achieve significantly smoother surfaces than is possible using abrasives. Abrasives, for example, sand having a granulation of between 0.1 and 0.5 mm, can cause severe grooves in the surface of the multilayer components during the abrading process. This can result in local unevenness in the surface. When the multilayer components are used for generating plasma, said unevenness may lead to local field boostings, which may result in local ignitions of plasma at undesired locations of the multilayer components. As a result, firstly the efficiency is reduced, and secondly the component is damaged under certain circumstances, with the result that a premature failure of the component may occur.

By contrast, dispensing with an abrasive makes it possible to ensure a smooth, rounded surface of the multilayer components. Accordingly, the surface of a piezoelectric multilayer component fabricated by the method according to embodiments of the invention does not have significant local unevenness. Therefore, it is possible to avoid the local field boosting resulting from local peaks in the roughness of the surface. A smooth, rounded surface can be ensured even in the region of the edges of the multilayer component.

A further advantage of the method in which no abrasive is used is that after the conclusion of the grinding process, it is possible to dispense with the step of separating the multilayer components from the abrasive. This step is very complex under certain circumstances. By dispensing with an additional abrasive, production can thus be carried out with fewer method steps. Therefore, the production method is able to be carried out cost-effectively and rapidly.

During the method the material can be abraded both from the outer surfaces and from the edges of the piezoelectric multilayer components. The outer surfaces can comprise four side surfaces, the surface normal of which is in each case perpendicular to a longitudinal axis of the multilayer components, and two end surfaces, the surface normal of which is in each case parallel to the longitudinal axis. In this case, two adjacent outer surfaces can always be perpendicular to one another. In this case, two adjacent outer surfaces respectively adjoin an edge. The piezoelectric multilayer component can be substantially parallelepipedal. However, the method is also suitable for differently shaped multilayer components, for example, for cylindrical components.

As a result of the material abrasion from the outer surfaces, the outer surfaces can become smoother. That is to say that the roughness of the outer surfaces can decrease as a consequence of the material abrasion.

As a result of the material abrasion from the edges of the multilayer components, the edges can be rounded. Accordingly, a formerly pointed edge can be reshaped into a rounded edge by the method, wherein the radius of the rounded edge is all the greater, the more material was removed. In the case of piezoelectric transformers, rounded edges have the advantage over pointed edges that a local field increase does not occur at a rounded edge. Accordingly, an undesired plasma ignition cannot occur at a rounded edge.

The method described here is suitable for producing a wide variety of piezoelectric multilayer components, for example, for producing transformers, actuators or capacitors.

During the grinding, the piezoelectric multilayer components can be present in a loose state. By way of example, the components can be arranged in a loose state in a drum. In this case, loose state may denote a state in which the multilayer components are not mechanically connected to one another.

The grinding of the piezoelectric multilayer components as described here is intended to serve to remove a surface of the piezoelectric multilayer components themselves. The intention is not to free the surface of the piezoelectric multilayer components from contamination. During the production method, there is usually no contamination that would need to be removed on the surface.

The piezoelectric multilayer components can be ground as green bodies, wherein the piezoelectric multilayer components are sintered after the grinding.

A green body is a blank that has not been fired. A green body is a body in the green state, that is to say a ceramic body before a firing or sintering process is carried out. In the green state, material can be removed from the multilayer components in a simple manner since the hardness of the multilayer components before sintering is significantly lower than after a sintering process has been carried out. Since the material abrasion would be considerably more complex after sintering, the grinding process is preferably carried out before sintering.

A green body has a hardness that is significantly lower than the hardness of a typical hard bulk material, such as, for instance, a screw, a nail or a steel spring. The green body is softer and more elastic than such metal parts.

The green body often contains an organic binder required for the prior shaping. The organic binder typically comprises plasticizers. The latter can be removed by a thermal treatment, wherein the component becomes harder.

A heat treatment process can be carried out before the grinding of the piezoelectric components. In the heat treatment process, the piezoelectric component can be exposed to elevated temperatures of 100° C. to 150° C. In this case, the plasticizers of the organic binder can be at least partly removed. The hardness of the component is increased as a result of the plasticizers being removed. Accordingly, the hardness of the component can be set in a desired manner by means of the heat treatment process. In particular, the heat treatment process can make it possible to set the hardness of the piezoelectric components in such a way that the latter are not deformed in an undesired manner during the grinding.

The temperature chosen in the heat treatment process depends on the plasticizer used. The heat treatment process can be carried out under reduced pressure.

The heat treatment process can serve to evaporate solvents and/or plasticizers from an organic binder and thus from the piezoelectric multilayer component. The multilayer components become harder as a result of the heat treatment process. In one embodiment, it is only after carrying out the heat treatment process that the piezoelectric multilayer components have a hardness which enables grinding without abrasives.

During the heat treatment process, the binder or a polymer of the binder is not decomposed. The binder is not driven out from a ceramic of the piezoelectric multilayer component in gaseous form. The heat treatment process is thus not a process of binder removal. The temperature range of 100° C. to 150° C. that occurs during the heat treatment process is not sufficient for binder removal. Rather the polymer is left intact during the heat treatment process. The component can become harder as a result of the at least partial removal of the solvent and/or of the plasticizers, but it remains a green blank. The step of binder removal can only be carried out after the step of grinding without the addition of an abrasive.

A hardness of the piezoelectric multilayer component can be increased during the heat treatment process.

A solvent and/or plasticizers of an organic binder can be at least partly removed from the piezoelectric multilayer component during the heat treatment process.

The piezoelectric multilayer components can be exposed to temperatures of 100° C. to 150° C. during the heat treatment process.

After the grinding, the components can be dried, if appropriate.

After the grinding and, if appropriate, after the drying, thermal processes are carried out, for example, binder removal and/or sintering.

The grinding can be carried out in a drum loaded with a plurality of the piezoelectric multilayer components, wherein the material abrasion is set in a desired manner by setting at least one of running time of the grinding process, number of piezoelectric multilayer components in the drum and rotational speed of the drum. The three parameters mentioned here in each case influence the material abrasion during the grinding process.

By increasing the running time, that is to say the time for which the drum rotates, the removal of the material from the multilayer components is increased. In this case, running time and material abrasion are almost linear in relation to one another.

The rotational speed of the drum, that is to say the speed at which the drum rotates, likewise influences the material abrasion of the multilayer components. The exact influence of the rotational speed on the material abrasion depends on the geometry and the size and also the exact construction of the multilayer components. The rotational speed should be chosen in such a way that the highest possible material abrasion per second is achieved, in order in this way to minimize the duration of the grinding process.

The number of piezoelectric multilayer components in the drum, that is to say the loading of the drum, should likewise be set to a value that is optimum for the material abrasion. If too many multilayer components are loaded into the drum per unit volume, then the multilayer components may become wedged together and hardly any rubbing of the components against one another occurs. The material abrasion is greatly inhibited as a result. As well, if too few multilayer components are loaded into the drum, only few processes of the components rubbing against one another occur, as a result of which the achievable rubbing would likewise be reduced.

The multilayer components can be surrounded by the medium water during the grinding. In this case, water does not act as an abrasive since the water does not provide for a material abrasion from the surface of the multilayer components. In particular, besides the multilayer components, only water and air can be situated in the drum during the grinding of the piezoelectric multilayer components. A different liquid can also be used as an alternative or in addition to water.

Water or a different liquid serves to keep the abraded material in suspension. If no liquid is used as medium, then the abraded material may settle as dust on the surfaces of the components and stick them together. Further removal could be prevented or at least hampered as a result. Moreover, the use of water or a different liquid as medium results in a damping of the movements of the piezoelectric components, thus resulting in more uniform movements overall, such that the material is removed more uniformly from the piezoelectric multilayer components.

The water can furthermore serve to influence a surface tension. Soap can be added to the water for this purpose.

The piezoelectric multilayer components can be piezoelectric transformers. In particular, they can be transformers which are suitable for use in a plasma generator for generating non-thermal atmospheric pressure plasma. In the case of these components, it is particularly important to obtain a smooth, rounded surface since otherwise local field boostings would give rise to plasma ignitions in an undesired manner, which could result in damage to the component.

BRIEF DESCRIPTION OF THE DRAWINGS

The present invention is described in greater detail below with reference to the figures.

DETAILED DESCRIPTION OF ILLUSTRATIVE EMBODIMENTS

Figure 1:
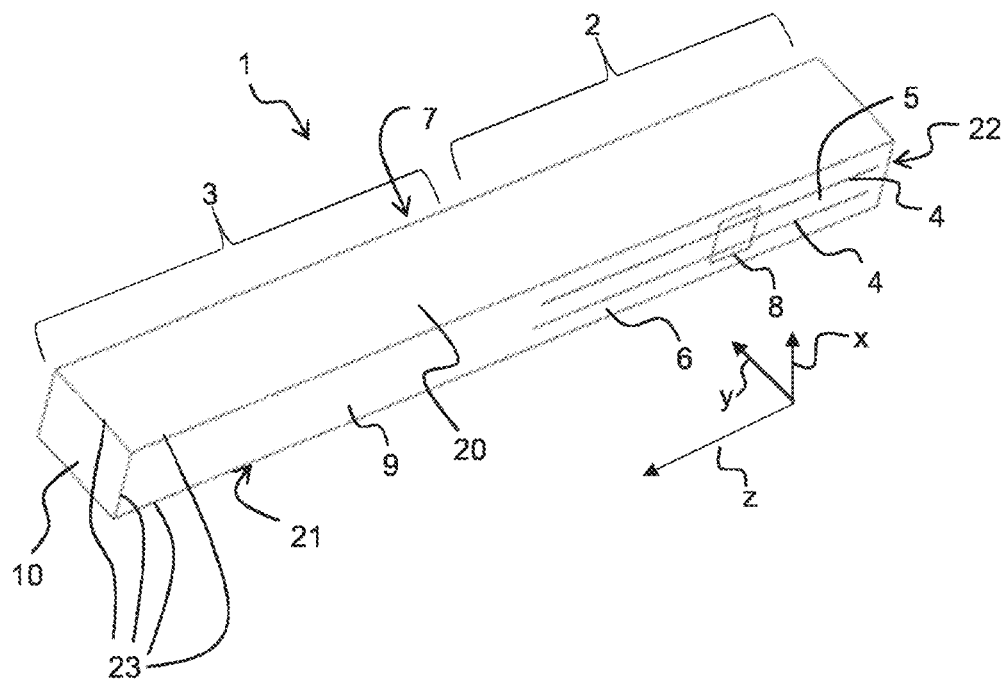
FIG. 1 shows a perspective view of a piezoelectric multilayer component.

FIG. 1 shows a perspective view of a piezoelectric multilayer component 1 which was fabricated by the method according to embodiments of the invention. The piezoelectric multilayer component 1 is a piezoelectric transformer. The piezoelectric transformer can be used in particular in a device for generating non-thermal atmospheric pressure plasma.

A piezoelectric transformer is a design of a resonance transformer which is based on piezoelectricity and constitutes an electromechanical system in contrast to the conventional magnetic transformers. The piezoelectric transformer is a Rosen-type transformer, for example.

The piezoelectric multilayer component 1 comprises an input region 2 and an output region 3, wherein the output region 3 is adjacent to the input region 2 in a longitudinal direction z. In the input region 2, the piezoelectric multilayer component 1 comprises electrodes 4, to which an AC voltage can be applied. The electrodes 4 extend in the longitudinal direction z of the piezoelectric multilayer component 1. The electrodes 4 are stacked alternately with a piezoelectric material 5 in a stacking direction x, which is perpendicular to the longitudinal direction z. In this case, the piezoelectric material 5 is polarized in the stacking direction x.

A y-direction y is in each case perpendicular to the stacking direction x and the longitudinal direction z.

The electrodes 4 are arranged in the interior of the piezoelectric multilayer component 1 and are also referred to as internal electrodes. The piezoelectric multilayer component 1 comprises a first side surface 6 and a second side surface 7 opposite the first side surface 6. A first external electrode 8 is arranged on the first side surface 6. A second external electrode (not shown) is arranged on the second side surface 7. The internal electrodes 4 are electrically contacted alternately either with the first external electrode 8 or the second external electrode in the stacking direction x.

Furthermore, the piezoelectric multilayer component 1 comprises a third side surface 20 and a fourth side surface 21, which are opposite one another and which are arranged perpendicular to the first side surface 6 and the second side surface 7. The surface normals of the third and fourth side surfaces 20, 21 point in each case in the stacking direction x.

The input region 2 can be driven with a low AC voltage that is applied between the electrodes 4. On account of the piezoelectric effect, the AC voltage applied on the input side is firstly converted into a mechanical oscillation. In this case, the frequency of the mechanical oscillation is essentially dependent on the geometry and the mechanical construction of the piezoelectric multilayer component 1.

The output region 3 comprises piezoelectric material 9 and is free of internal electrodes. The piezoelectric material 9 in the output region is polarized in the longitudinal direction z. The piezoelectric material 9 of the output region 3 can be the same material as the piezoelectric material 5 of the input region 2, wherein the piezoelectric materials 5 and 9 can differ in their polarization direction. In the output region 3, the piezoelectric material 9 is shaped to form a single monolithic layer polarized completely in the longitudinal direction z. In this case, the piezoelectric material 9 in the output region 3 has only a single polarization direction.

If an AC voltage is applied to the electrodes 4 in the input region 2, then a mechanical wave forms within the piezoelectric material 5, 9, which mechanical wave generates an output voltage as a result of the piezoelectric effect in the output region 3. The output region 3 has an output-side end surface 10. In the output region 3, an electrical voltage is thus generated between the end surface 10 and the end of the electrodes 4 of the input region 2. In this case, a high voltage is generated at the output-side end surface 10. In this case, a high potential difference also arises between the output-side end surface and an environment of the piezoelectric multilayer component, which potential difference suffices to generate a strong electric field that ionizes a process gas.

In this way, the piezoelectric multilayer component 1 generates high electric fields that are able to ionize gases or liquids by electrical excitation. In this case, atoms or molecules of the respective gas or of the respective liquid are ionized and form a plasma. An ionization occurs whenever the electric field strength at the surface of the piezoelectric multilayer component 1 exceeds the ignition field strength of the plasma. In this case, ignition field strength of a plasma denotes the field strength required for the ionization of the atoms or molecules.

The piezoelectric multilayer component 1 furthermore comprises an input-side end surface 22 opposite the output-side end surface 10. Furthermore, the piezoelectric multilayer component 1 comprises edges 23. The edges 23 can be rounded.

During its production the piezoelectric multilayer component 1 is subjected to a grinding process in which no abrasive is used and in which a material abrasion of the piezoelectric multilayer component 1 is carried out by rubbing the piezoelectric multilayer component 1 against further piezoelectric multilayer components.

Figure 2:
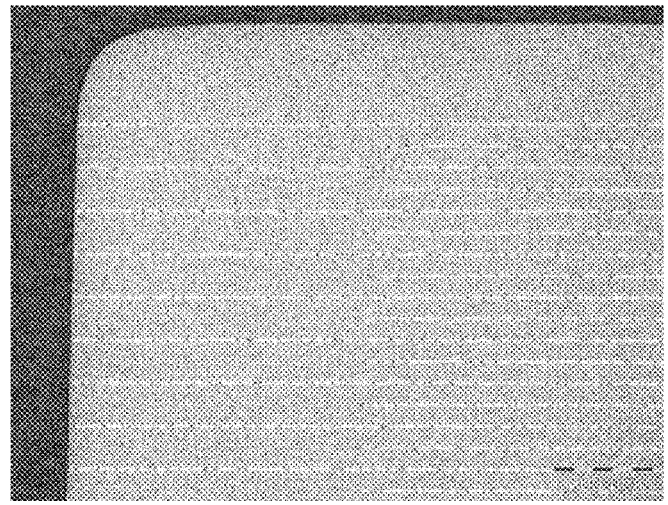
FIG. 2 shows a close-up image of a multilayer component which was produced by the method according to embodiments of the invention.

FIG. 2 shows a close-up image of a segment of a piezoelectric multilayer component 1 which was fabricated by the method described here, wherein a material abrasion from the side surfaces 6, 7, 20, 21, the end surfaces 21, 22 and the edges 23 of the piezoelectric multilayer component 1 is carried out by rubbing the components against one another. In this case, the multilayer components are arranged in a loose state in a drum.

Figure 3:
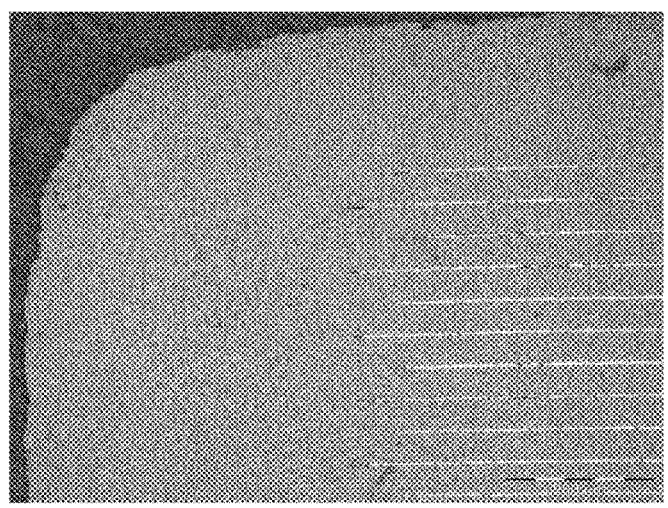
FIG. 3 shows a close-up image of a comparative example of a multilayer component which was fabricated using the abrasive $ZrO_2$.

In comparison therewith, FIG. 3 shows a close-up image of a comparative example of a multilayer component which was subjected to an abrading process in which $ZrO_2$ was used as abrasive.

A comparison of FIGS. 2 and 3 shows that by dispensing with an abrasive, it is possible to remove the material from the side surfaces and edges of the multilayer components in a manner that leads to less rough side surfaces and more smoothly rounded edges. In this way, the arising of local unevenness at the outer surfaces of the multilayer component can be avoided. Accordingly, the undesired plasma ignition at such local unevenness can be avoided.

Figure 4:
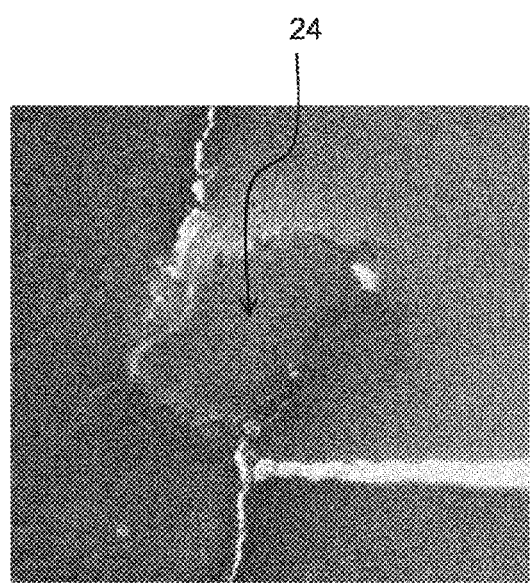
FIG. 4 shows a further close-up image of a comparative example of a multilayer component which was fabricated using an abrasive.

FIG. 4 shows a close-up image of a comparative example of a piezoelectric multilayer component which was ground without a heat treatment process having been carried out previously and using an abrasive comprising abrasive grains. FIG. 4 shows that an abrasive grain 24 was pressed into the piezoelectric multilayer component during the grinding process and has remained in the component after the grinding process. The abrasive grain 24 has an adverse effect in the multilayer component 1. It leads, for example, to a considerable unevenness of the surface.

By comparison with grinding the piezoelectric multilayer components without an abrasive, the use of an abrasive merely has the advantage that the surface can be removed more rapidly. However, this is outweighed by the disadvantage that, with the use of an abrasive, the surface becomes significantly rougher, as shown in FIG. 3, and that it is even possible for grains of the abrasive to penetrate into the surface.

Alternatively, it is also conceivable to grind the piezoelectric multilayer components jointly with ceramic cones and without the addition of an abrasive. In this case, it is possible to achieve a smoothness of the surfaces which is comparable with the result of the material abrasion by rubbing the piezoelectric multilayer components 1 against one another. However, an additional step for separating the piezoelectric multilayer components and the ceramic cones after grinding is then required as well.

If the piezoelectric multilayer components 1 are rubbed against one another, a smooth surface can be obtained. If the grinding process is performed for two hours, the edges of the piezoelectric multilayer components 1 can be rounded in a desired manner.

The invention claimed is:

1. A method for producing a plurality of piezoelectric multilayer components, the method comprising:
grinding the piezoelectric multilayer components without an addition of an abrasive by rubbing the piezoelectric multilayer components against one another so that a material abrasion of the piezoelectric multilayer components is carried out, wherein grinding the piezoelectric multilayer components is carried out in a drum loaded with the plurality of the piezoelectric multilayer components, and wherein the material abrasion is set by setting a number of piezoelectric multilayer components in the drum; and
performing a heat treatment process in which the piezoelectric multilayer components are exposed to an elevated temperature before grinding the piezoelectric multilayer components, wherein, while performing the heat treatment process, a polymer of a binder is not decomposed, and wherein the heat treatment process is carried out under reduced pressure.

2. The method according to claim 1, wherein the piezoelectric multilayer components are ground as green bodies.

3. The method according to claim 1, further comprising sintering the piezoelectric multilayer components after grinding the piezoelectric multilayer components.

4. The method according to claim 1, wherein a hardness of the piezoelectric multilayer components is increased during the heat treatment process.

5. The method according to claim 1, further comprising at least partly removing a solvent and/or plasticizers of an organic binder from the piezoelectric multilayer components during the heat treatment process.

6. The method according to claim 1, wherein the elevated temperature is a temperature between 100° C. to 150° C. inclusive.

7. The method according to claim 1,
wherein the material abrasion is further set by setting at least one of a running time of the grinding of the piezoelectric multilayer components or a rotational speed of the drum.

8. The method according to claim 1, wherein grinding the piezoelectric multilayer components comprises grinding the piezoelectric multilayer components by surrounding them with water.

9. The method according to claim 1, wherein the piezoelectric multilayer components are piezoelectric transformers.

10. The method according to claim 1, wherein the piezoelectric multilayer components are capacitors.

11. A method for producing a plurality of piezoelectric multilayer components, the method comprising:
grinding the piezoelectric multilayer components without an addition of an abrasive by rubbing the piezoelectric multilayer components against one another so that a material abrasion of the piezoelectric multilayer components is carried out, wherein the grinding the piezoelectric multilayer components comprises grinding the piezoelectric multilayer components by surrounding them with water, and wherein soap is added to the water prior to the grinding; and
performing a heat treatment process in which the piezoelectric multilayer components are exposed to an elevated temperature before grinding the piezoelectric multilayer components, wherein, while performing the heat treatment process, a polymer of a binder is not decomposed, and wherein the heat treatment process is carried out under reduced pressure.

* * * * *